United States Patent [19]

Neathery et al.

[11] 4,386,285
[45] May 31, 1983

[54] DIGITALLY CONTROLLABLE ANALOG SWITCH

[75] Inventors: David O. Neathery, St. Charles; Edward J. Riggs, West Chicago, both of Ill.

[73] Assignee: King Instrument Corporation, Westboro, Mass.

[21] Appl. No.: 202,669

[22] Filed: Oct. 31, 1980

[51] Int. Cl.³ .................. H03K 17/56; H03K 3/42
[52] U.S. Cl. .................. 307/311; 307/241; 307/490
[58] Field of Search ............. 307/490, 493–502, 307/241, 243, 311

[56] References Cited

U.S. PATENT DOCUMENTS

| | | | |
|---|---|---|---|
| 2,812,445 | 11/1957 | Anderson | 307/311 |
| 3,304,429 | 2/1967 | Bonin et al. | 307/311 |
| 3,349,319 | 10/1967 | Aiken | 307/311 |
| 3,539,928 | 11/1970 | Gardner et al. | 307/243 |
| 3,885,220 | 5/1975 | Fluegal | 307/243 |
| 4,075,512 | 2/1978 | Rast, Jr. et al. | 307/311 |

Primary Examiner—Stanley D. Miller
Assistant Examiner—B. P. Davis
Attorney, Agent, or Firm—Schiller & Pandiscio

[57] ABSTRACT

An operational amplifier for generating an output analog signal at an output node representative of an analog signal fed to the non-inverting input of the operational amplifier. A controllable switch connects the output of the operational amplifier to the output node, and the signal at the output node is fed back to the inverting input of the operational amplifier. The controllable switch is responsive to a digital logic control signal for completing the circuit path between the operational amplifier and the output node in order to generate the output analog signal. A plurality of such operational amplifiers have their feedback path connected at a common output node.

8 Claims, 1 Drawing Figure

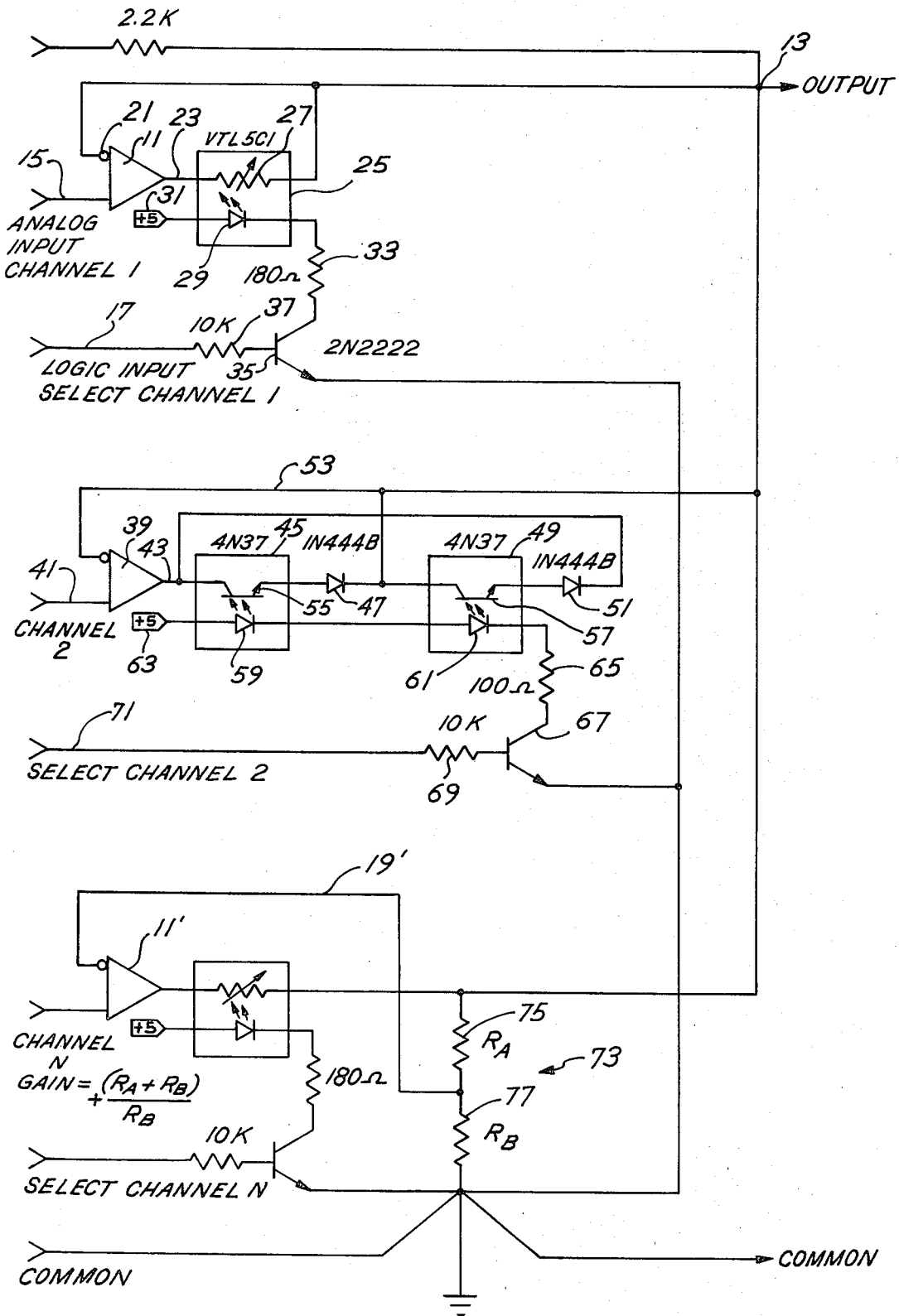

DIGITALLY CONTROLLABLE ANALOG SWITCH

BACKGROUND OF THE INVENTION

The invention relates to a digitally controlled analog switch and more particularly relates to an analog switch system for digitally controlling the transmission of one of a plurality of analog signals along a single output conductor.

Heretofore, one technique for controlling the transmission of analog signals between two points has utilized electromechanical switches. However, the reliability of electromechanical switches leaves something to be desired. Such switches may not always switch properly and the mechanical components of such switches may stick in one position causing the switch to remain in an ON or OFF state. For example, the mechanical reeds in a micro-reed relay sometimes become welded together sticking the switch in an ON position.

Further, contact noise is developed from contact closure in mechanical switches which gives rise to error voltages introduced into the analog signal whose transmission is being controlled. Also, external temperature may affect the mechanical operation and noise generation of some mechanical switches.

In an effort to overcome the disadvantages of mechanical switches, electrical switches are sometimes used. Electrical switches may be described as switches with no mechanically moving parts. However, due to the electrical nature of such switches, offset voltage errors and other types of signal noise from the electrical switch are imparted into the analog signal whose transmission is being controlled. Thus, it is highly desireable to have a switch which is capable of passing an analog signal free of noise signal errors.

SUMMARY OF THE INVENTION

Therefore, it is an object of the present invention to provide a reliable analog switch for passing analog signals substantially free of signal errors.

It is yet another object of the present invention to provide a reliable analog switch is controllable by a digital signal.

These and other objects of the invention are achieved by the use of an operational amplifier in connection with a digitally operated switch for electrically correcting for signal errors introduced by the digitally operated switch and by the operational amplifier.

BRIEF DESCRIPTION OF THE DRAWING

The single FIGURE is an electrical schematic of an analog switch system having three switch implementations.

DESCRIPTION OF THE PREFERRED EMBODIMENT

Referring to the single FIGURE, an analog switch system having three different implementations of a digitally controlled analog switch is illustrated. A conventional, operational amplifier (op amp) 11 is connected to drive a common output node 13 according to an analog input signal appearing at the non-inverting input 15 of op amp 11. An analog signal representative of the analog input signal is produced at node 13 in accordance with the logic state of a logic signal appearing on a logic input conductor 17.

A feedback conductor 19 connects output node 13 to the inverting input 21 of op amp 11 in order for the op amp to regulate the voltage at node 13 in accordance with the analog signal at the non-inverting input. The output 23 of the op amp is connected to output node 13 via a digital switch 25 which effectively connects output 23 to node 13 in accordance with the logic signal appearing on conductor 17. Switch 25 includes an optically sensitive element 27 which is preferably a cadmium sulfide photoresistor. A light emitting diode 29 is positioned in relation to photoresistor 27 for decreasing the resistance of the photoresistor responsive to light from diode 29 or increasing the resistance responsively to the absence of such light, to respectively effectively open and close the circuit path between output 23 and node 13.

The anode of light emitting diode 29 is connected to a five volt source 31, and the cathode of light emitting diode 29 is connected to ground via the series connection of a resistor 33 and a collector-emitter path of a transistor 35. The base of the transistor 35 is connected to logic input conductor 17 via a resistor 37. A HIGH logic signal appearing on conductor 17 enables transistor 35 for passing current along its collector-emitter path, thus actuating light emitting diode 29, as understood.

In operation, a HIGH logic signal on conductor 17 turns on diode 29 which causes photoresistor 27 to change its resistive state to a very low impedance, to effectively close the circuit path between output 23 and node 13. Op amp 11 then receives the feedback signal of its output and controls the voltage appearing at node 13 in accordance with the analog signal at its non-inverting input such that the analog signal appearing at node 13 is directly proportional to the analog signal at non-inverting input 15. Because the operational amplifier varies its output at 23 in order to keep the voltage at node 13 in accord with the analog signal at input 15, any noise signals introduced in the circuitry by switch 25 or op amp 11 will be reduced. The factor by which the noise signals are reduced may be expressed by a factor equal to the quantity $1/(1+G)$, where G is the effective gain of the op amp, usually a large number, e.g., 10,000.

The second implementation illustrated in the single FIGURE includes an operational amplifier 39 for receiving a second analog input signal at its non-inverting input 41. The output 43 of op amp 39 is connected to output node 13 via a first digital switch 45, connected in series with the anode-cathode path of a diode 47, and a second digital switch 49 and second diode 51 connected in parallel with the first digital switch and first diode, as shown. A feedback conductor 53 connects output node 13 to the inverting input of op amp 39.

Each of switches 45, 49 includes a respective phototransistor 55, 57. A pair of light emitting diodes 59, 61 are connected in series and positioned for separately actuating an individual phototransistor 55, 57, as illustrated. Light emitting diodes 59, 61 are connected across a five volt source 63 and ground via a resistor 65 and a collector-emitter path of a transistor 67. A resistor 69 connects a second logic input conductor 71 through resistor 69 to the base of transistor 67 for actuation of the same according to the logic level input along conductor 71.

Photoresistor 27 in the switch implementation at the top of the drawing is a non-polar device in the current may travel in either direction through the photoresistor. The switch implementation at the middle of the drawing is one in which the phototransistors 55, 57 are better used in a polar manner because of their nonsymmetric gain and signal blocking capabilities. As shown, when using polar devices (the phototransistors), two devices are necessary to provide a path for current in each direction. Diodes 47, 51 serve as steering diodes to prevent reverse currents from passing through phototransistors 55, 57.

The implementation in the lower portion of the drawing illustrates a similar photoresistor implementation with additional circuitry for securing a gain of the input analog signal greater than unity for scaling up the input analog signal. The feedback for the op amp is derived from a dividing network 73 between the common output node 13 and ground (or some other reference voltage). A pair of resistors 75, 77 form the dividing network, and are series-connected between output node 13 and ground. The junction between resistors 75, 77 is connected to the inverting input of the op amp 11' by feedback conductor 19'.

It should be understood, of course, that the foregoing disclosure relates to preferred embodiments of the invention and that modifications or alterations may be made in such embodiments without departing from the spirit or scope of the invention as set forth in the appended claims.

What is claimed is:

1. An analog switch for generating a representation of an analog input signal responsive to a predetermined logic state of a digital control signal, said switch comprising:
   an analog signal input terminal for receiving said analog input signal;
   an analog signal output terminal for providing said representation;
   operational amplifier means including (1) a non-inverting input terminal coupled to said analog signal input terminal, (2) an inverting input terminal, and (3) an output terminal coupled to said analog signal output terminal;
   variable impedance means connected between the output and inverting input terminals of said amplifier and adapted to vary its electrical impedance responsively to an optical signal;
   a digital signal input terminal for receiving said digital control signal;
   optical signal generating means electrically isolated from said variable impedance means for generating said optical signal in response to an energizing signal, and switching means coupled to said digital input terminal and adapted to be conductive in response to said digital control signal so as to generate said energizing signal, and non-conductive in the absence of said digital control signal.

2. A switch according to claim 1 wherein said variable impedance means includes photoresistive means electrically connected between said output terminal of said operational amplifier means with said analog signal output terminal; and said optical signal generating means includes photoelectric means positioned with respect to said photoresistive means for generating light to actuate said photoresistive means, said photoelectric means generating light responsive to the digital control signal.

3. A switch according to claim 2 wherein said photoelectric means include:
   voltage source means connected to one side of said photodiode for producing a current through said photodiode; and
   photodiode means connected between said voltage source means and said switching means.

4. A switch according to claim 3 wherein said switching means includes a transistor having a collector emitter path connected in series with said photodiode, the base of said transistor means being responsive to the digital control signal.

5. A switch according to claim 1 wherein said variable impedance means indludes a pair of switching devices connected in parallel with one another each between said inverting input terminal and output terminal of said operational amplifier and unidirectional current conduction means connected to each of said switching devices so that said switching devices respectively conduct currents of opposite polarity.

6. A switch according to claim 5 wherein each of said switching devices includes: phototransistor means; and said optical signal generating means includes photoelectric means for each of said phototransistors, said photoelectric means being positioned relative to said phototransistor means and connected to said digital signal input terminal for reducing the impedance of said phototransistor means in response to said digital control signal.

7. A switch according to claim 6 wherein both of said photoelectric means are actuated substantially simultaneously in response to the digital control signal.

8. A switch according to claim 1 and further including scalar means including first and second impedance elements for scaling the value of said representation with respect to said analog input signal.

* * * * *

UNITED STATES PATENT AND TRADEMARK OFFICE
CERTIFICATE OF CORRECTION

PATENT NO. : 4386285
DATED : 5/31/83
INVENTOR(S) : David O. Neathery

It is certified that error appears in the above-identified patent and that said Letters Patent is hereby corrected as shown below:

Claim 3, column 4, line 15, "include" should be -- includes --; and

Claim 5, column 4, line 27, "indludes" should be -- includes --.

Signed and Sealed this

Second Day of August 1983

[SEAL]

Attest:

Attesting Officer

GERALD J. MOSSINGHOFF

Commissioner of Patents and Trademarks